United States Patent [19]

Butz et al.

[11] Patent Number: 4,630,066

[45] Date of Patent: Dec. 16, 1986

[54] SIGNAL QUANTIZER

[75] Inventors: Mark G. Butz, Cincinnati, Ohio; William J. Zacharias, Villa Hills, Ky.

[73] Assignee: General Electric Company, Cincinnati, Ohio

[21] Appl. No.: 665,519

[22] Filed: Oct. 31, 1984

Related U.S. Application Data

[63] Continuation of Ser. No. 404,728, Aug. 3, 1982, abandoned.

[51] Int. Cl.$^4$ .................. G01D 9/00; G01D 15/10
[52] U.S. Cl. ...................... 346/33 EC; 346/76 R; 328/115; 307/360
[58] Field of Search ............ 307/360, 361; 328/115, 328/116, 117, 150; 346/33 EC, 76 R; 358/297

[56] References Cited

U.S. PATENT DOCUMENTS

| | | | |
|---|---|---|---|
| 2,636,983 | 4/1953 | Poole | 328/116 |
| 3,772,515 | 11/1973 | Soini | 328/116 |
| 4,006,412 | 2/1977 | Campbell et al. | 307/361 |
| 4,074,260 | 2/1978 | Butler et al. | 340/347 CC |
| 4,096,484 | 6/1978 | Ferre | 346/33 EC |
| 4,183,016 | 1/1980 | Sawagata | 307/361 |
| 4,193,066 | 3/1980 | Morrison et al. | 340/347 CC |
| 4,229,729 | 10/1980 | Devendorf | 307/361 |
| 4,255,740 | 3/1981 | Ferrie | 328/117 |
| 4,303,880 | 12/1981 | Munt et al. | 324/99 D |
| 4,309,772 | 1/1982 | Kloker et al. | 375/76 |

OTHER PUBLICATIONS

Sales bulletin, Product Data 50-82-M90S from Automation Industries, Inc., Shelter Rock Road, Danbury, Connecticut.

*Primary Examiner*—E. A. Goldberg
*Assistant Examiner*—Mark Reinhart
*Attorney, Agent, or Firm*—Gregory A. Welte; Derek P. Lawrence

[57] ABSTRACT

A signal quantizer is disclosed which compares an input signal with a plurality of predetermined adjustable thresholds, associates with each threshold a potential output signal of predetermined adjustable magnitude, identifies the largest threshold exceeded by the input signal, and produces as an output signal a signal representative of the potential output signal associated with the threshold identified.

1 Claim, 2 Drawing Figures

SIGNAL QUANTIZER

This is a continuation of application Ser. No. 404,728, filed Aug. 3, 1982, now abandoned.

The invention relates to quantizers for signals and, more particularly, to such quantizers which provide adjustable quantizing thresholds and an adjustable output associated with each threshold.

BACKGROUND OF THE INVENTION

There are many situations in which signals must be quantized. Quantizing is here defined by example: the numbers 0, 1, 2, 3, 4, 5, can represent the quantum levels (or threshold levels) used for quantizing a signal. The signal itself, however, may have any value between 0 and 5, including a fractional value such as 2.5. Quantizing (sometimes called digitizing) ascribes a value to, or "rounds off," a signal whose value falls between, and not exactly on, the quantum levels. The value ascribed to the signal can be the value of the largest quantum level which the signal value equals or exceeds. Thus, signals of values 1.25, 2.75, and 4 would be ascribed values of 1, 2, and 4 as output signals, respectively.

In some situations, it is desirable to provide a signal quantizer having adjustable threshold levels and, further, having a means for adjusting the quantized output signals.

For example, as shown in FIG. 1, which is a schematic diagram of the present invention shown in conjunction with the invention of D. Copley (more fully identified below in the Detailed Description of the Invention), a machine-tooled workpiece 3 can be scanned by a movable eddy current probe or other inspection transducer 6 which produces an electrical signal indicative of surface features contained on the workpiece 3. This signal is carried by a conduit 9 to a signal processor 12 which converts the signal to a direct current signal 13 which is transmitted along conduit 15, through switches 16A and 16B, and to a power amplifier 19 which amplifies the direct current signal 13 and transmits an amplified signal 20 along conduit 22 to an electrode pen 25. A point 27 of electrode pen 25 is in contact with a record paper 30 which is connected to ground by a conduit 33. The current signal carried by conduit 22 and traveling through record paper 30 generates heat at the point of contact 27 between electrode pen 25 and record paper 30 and this heat produces a small burn mark in record paper 30. Variations in the signal present on conduit 22 induced by variations in the signal produced by the eddy current transducer 6 cause variations in the degree of burning and thus produce variations in the color of the mark burned into record paper 30.

In practice, the eddy current probe 6 is moved with respect to the machine-tooled workpiece 3 by mechanical devices (not shown) and, simultaneously, the electrode pen 25 is mechanically moved with respect to record paper 30 in a corresponding manner. Thus, the scanning path of the probe 6 along workpiece 3 is mapped identically and to scale onto record paper 30 by the burn marks produced by electrode pen 25. Accordingly, variations in the surface features of workpiece 3 are mapped and indicated by burn marks present on record paper 30.

A problem arises in the use of this system because the signal, produced by the eddy current probe 6, is generally a continuously varying analog signal. Thus, the burn marks produced are similarly varying along a color spectrum ranging from white or light gray to dark gray or black. A particular problem found will be illustrated by example.

It is assumed that the color spectrum can be represented by a number sequence from 0 to 10 in which 0 represents white or light gray and 10 represents black or dark gray. Two colors, such as colors 5 and 6, can be adjacent on record paper 30, but the difference in grayness between them can be difficult to distinguish because the color darkens continuously from the location of color 5 to that of color 6. There is no clear line of demarcation. Thus, it is difficult to interpret the burn marks produced by eddy current probe 6 in this case.

Another problem arises in analyzing burn marks recorded upon different types of record papers or upon record papers of the same type but at different times. In the former situation, the differences in record papers can cause identical eddy current probe signals to produce different burn marks. In the latter situation, differences in the environment, such as humidity or temperature differences, occurring at the different times, can similarly cause nonuniform burn marks to result from identical probe signals. In both situations, it is difficult to compare the different records of eddy current signals.

OBJECTS OF THE INVENTION

It is an object of the present invention to provide a new and improved signal quantizer.

It is a further object of the present invention to provide such a signal quantizer which quantizes a signal according to adjustable predetermined quantum thresholds.

It is a further object of the present invention to provide a new and improved signal quantizer which allows adjustment of the output signal corresponding to each quantum level.

SUMMARY OF THE INVENTION

One form of the invention compares an input signal with a plurality of predetermined adjustable signal thresholds. The invention associates with each threshold a potential output signal of predetermined adjustable magnitude. The invention compares the input signal with all of the thresholds, identifies the largest threshold crossed, and produces as an output the potential output signal corresponding to the threshold identified.

DETAILED DESCRIPTION OF THE INVENTION

Figure 1:
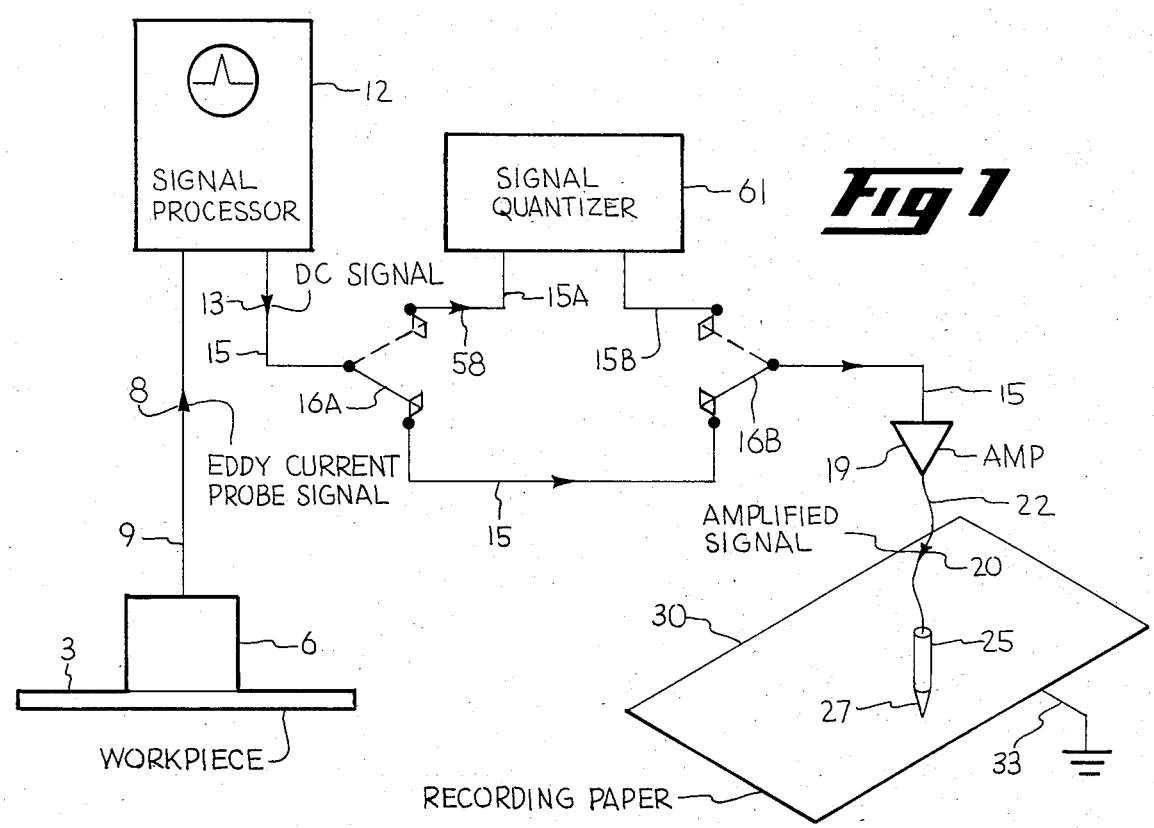
FIG. 1 depicts one form of the invention utilized in conjunction with signal processing equipment.
Figure 2:
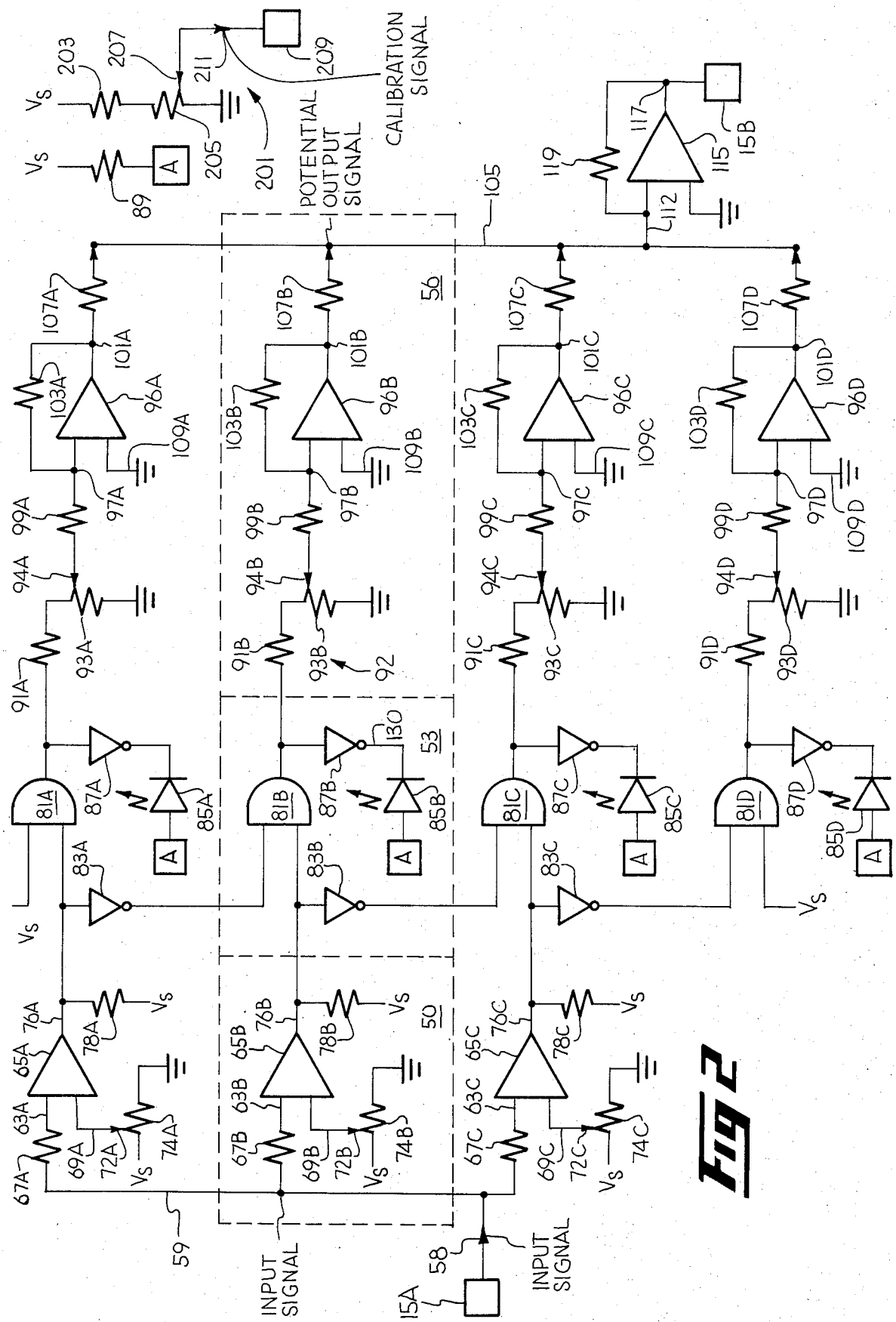
FIG. 2 is a schematic circuit diagram of one form of the invention.

FIG. 2 illustrates three identical comparator stages, one of which is contained within a dashed region 50. The Figure also shows four identical identification stages, one of which is contained within a dotted region 53 and also shows four identical stages for generating the potential output signals, one of which is contained within a dotted region 56. The actual number of each of the above type of stages to be used will depend upon the number of quantum thresholds desired by the user. The quantizing circuitry of FIG. 2 is shown as block 61 in FIG. 1 and switches 16A and 16B are used to splice block 61 into the system of FIG. 1.

The structures of the stages contained in the dotted regions 50, 53 and 56 are described as follows. With respect to comparator stage 50, an input signal bus 59, which is connected to conduit 15A in FIG. 1, is connected to one input 63B of a comparator 65B by means of an input resistor 67B. Comparator 65B is preferably an analog comparator. The other input 69B of comparator 65B is connected to a tap 72B of a variable resistor 74B. The variable resistor 74B is connected between a voltage source $V_s$ and ground. The output 76B of comparator 65B is connected to the voltage source $V_s$ by means of a pull-up resistor 78B.

With respect to identification stage 53, the output 76B of comparator 65B is connected to an input of AND gate 81B, the other input of which is connected to the output of an inverter 83A, the input of which is connected to the output of a comparator in another comparison stage, such as the output 76A of a comparator 65A. The output of the AND gate 81B is connected to one terminal of a light emitting diode (LED) 85B by means of an inverter 87B. The other terminal of LED 85B is connected to terminal A which is, as shown in the upper right corner of the Figure, connected to a voltage source $V_s$ by a resistor 89.

With respect to the potential output signal stage 56, a voltage divider network 92 comprising a resistor 91B and a variable resistor 93B is connected between ground and the output of AND gate 81B. A tap 94B on variable resistor 93B is connected to an input 97B of an operational amplifier (op-amp) 96B by means of a resistor 99B. The input 97B of op-amp 96B is connected to the output 101B of the op-amp by means of a resistor 103B. The output 101B of op-amp 96B is connected to a potential output bus 105 by means of a resistor 107B. The other input 109B of op-amp 96B is connected to ground.

The potential output bus 105 is connected to an input 112 of an op-amp 115, the output 117 of which is connected to an output signal terminal 15B (shown also in FIG. 1) as well as fed back to the input 112 by means of a resistor 119. The other input 121 of op-amp 115 is connected to ground. The output signal terminal 15B is to be connected through the switch 16B to the input of power amplifier 19 in FIG. 1 as discussed above.

It is to be noted that, as shown in FIG. 2, the number of both the identification stages 53 and the potential output signal stages 56 exceeds the number of comparator stages 50 by one stage. One reason for this is that the excess stage is used to produce a potential output signal when the input signal 58 exceeds no threshold. Further, AND gates 81A and 81D are connected differently than the rest of AND gates 81B-C: while one input of each of AND gates 81A-C is connected directly to a respective comparator output 76A-C, AND gate 81D is not so connected. Instead, one input of AND gate 81D is connected to comparator output 76C by means of inverter 83C and the other input is connected to the voltage source $V_s$. Moreover, while one input of each of AND gates 81B-81D is connected to a respective comparator output through inverters 83A-C, AND gate 81A is not so connected. Instead, one input of AND gate 81A is connected to the voltage source $V_s$ and the other input is connected to comparator output 76A.

The operation of the above-described circuitry is explained as follows. The taps 72A-C on adjustable resistors 74A-C are set to the desired thresholds. For example, if the voltage supply $V_s$ is established at +5 volts, taps 72A-C can be set so that the inputs 69A-C to comparators 65A-C are established respectively at 4.5, 3.5, and 2.5 volts. This establishes the voltage thresholds to which the input signal 58 as transmitted to comparator inputs 63A-C is compared.

The outputs 76A-C of comparators 65A-C will normally be at logical zero (or low) when the signal applied to inputs 63A-C fails to exceed the voltage thresholds. Thus, the outputs of AND gates 81A-C will similarly be zero. Since the inputs to AND gate 81D are both at logical one (or high), it provides a logical one as an output. This indicates that the input signal 58 is below the threshold of variable resistor 74C. If this threshold is the lowest, then the high output of AND gate 81D indicates that no threshold has been exceeded.

Assuming that an input signal 58 of 4.0 volts is applied to conduit 15A, the signal present at inputs 63A-C will similarly be approximately 4.0 volts, subject to the voltage drop across input resistors 67A-C. This 4.0 volt input signal exceeds both the thresholds at comparator inputs 69B-C, but not that at 69A. Accordingly, the comparators 65B-C (and not comparator 65A) are triggered and their outputs are pulled high by pull-up resistors 78B-C. However, only one of the AND gates (namely, AND gate 81B) among AND gates 81A-D produces a high output, and for the following reasons.

Regarding AND gate 81A, it produces an output of logical zero because comparator 65A has not been triggered: this comparator provides a logical zero to one input of AND gate 81A. Regarding AND gates 81C-D, they similarly produce an output of logical zero because they respectively receive as inputs the inverted (hence, logical zero) comparator outputs 76B-C. However, regarding AND gate 81B, it produces an output of logical one in receiving the output 76B (logical one) of triggered comparator 65B and the inverted output 76A (logical one) of nontriggered comparator 65A.

The output of AND gate 81B is applied both to LED 85B (indirectly) and to the voltage divider network 92 comprising resistor 91B and variable resistor 93B. In the case of LED 85B, the output of AND gate 81B is inverted by inverter 87B to a low voltage (logical zero) and then applied to terminal 130 of LED 85B causing a current to flow from voltage supply $V_s$ through resistor 89 to terminal A and through LED 85B. LED's 85 will preferably have associated with them printed markings (not shown) indicating their respective thresholds so that the illumination of LED 85B indicates the highest threshold which is crossed by the input signal 58.

In the case of the voltage divider network 92, a predetermined voltage as determined by the setting of tap 94B on variable resistor 93B is applied to the input 97B of op-amp 96B. This voltage is predetermined for two reasons. First, AND gates 81A-D are preferably identical, with the result that the output voltage produced by each when driven to logical one is a known voltage, such as 5 volts. Second, the tap 94B on variable resistor 93B selects a certain fraction of this output voltage, depending upon the values of resistor 91B and variable resistor 93B, and applies it to the input 97B of op-amp 96B by means of resistor 99B. Op-amp 96B amplifies the voltage at tap 94B in accordance with the feedback network comprising resistors 99B and 103B. Thus, the amplified voltage at output 101B is also predetermined. This amplified voltage (a potential output voltage) is fed to the potential output signal bus 105 by means of resistor 107B and this voltage is further amplified by the output amplification stage comprising op-amp 115 and resistors 107B and 119. (In some applications, the potential output voltage signal fed to the bus 105 may be desired itself and further amplification by op-amp 115 may not be necessary.) The output of op-amp 115 is fed to the output signal terminal 15B for further amplification by power amplifier 19 in FIG. 1 and subsequent transmission thereby to electrode pen 25.

FIG. 2 illustrates one form of calibration circuitry for use in establishing the desired threshold voltages.

The calibration circuitry consists of a voltage divider network 201 comprising a resistor 203 and a variable resistor 205 connected between the voltage source $V_s$ and ground. A tap 207 on variable resistor 205 is connected to a conduit 209 for developing a calibration signal 211. The calibration signal 211 can be connected to the input signal bus 59 by connecting conduit 15A with conduit 209. The operation of the calibration circuitry is as follows.

All taps 72A–C on variable resistors 74A–C are set to their $V_s$ side while tap 207 on variable resistor 205 is set to its ground side. Under these conditions, LED's 85A–C will be off and LED 85D will be on since the calibration signal 211 on the input signal bus 59 does not exceed any of the voltage thresholds 69A–C. One of the comparators' threshold voltages, such as that at input 69C, is established by initially adjusting tap 207 until the calibration signal 211 equals the desired threshold voltage for that comparator. This voltage can be read on a meter (not shown) connected to tap 207, or the tap 207 can be set to a predetermined position to achieve the voltage desired. Then tap 72C is adjusted until LED 85D goes out and LED 85C comes on. This indicates that the voltage threshold level at 69C is equal to that of the calibration signal 211. The next comparator stage is calibrated in the same manner by increasing the calibration signal 211 to the next desired voltage level and then adjusting tap 72B until LED 85B comes on and LED 85C goes out. The calibration procedure continues in the same manner for each stage.

The value of this internal calibration signal circuitry is at least threefold. The circuitry provides a rapid and simple method of calibrating the input comparator stages without the requirement of any other equipment. Also, the circuitry simulates an input signal 58 which can check the operation of the signal quantizer 61, the power amplifier 19, and the record paper 30 without having to set up a workpiece inspection. Finally, this calibration circuitry has the advantage that it is independent of the signal processor 12 of FIG. 1.

An invention has been described which compares an input signal with a plurality of predetermined, adjustable thresholds and identifies the largest threshold crossed by the input signal by illuminating a LED. Each threshold has associated with it in advance a predetermined adjustable potential output signal. The potential output signal corresponding to the largest threshold identified is amplified and applied to an output signal terminal. In this manner, adjustable quantum levels can be selected, as an example, for quantizing an eddy current probe signal and the output signal associated with each quantum level is further adjustable to accommodate conditions which affect the degree of burning of a record paper by an electrode pen. The invention has been described in connection with positive logic implementation. Of course, negative logic (in which a negative voltage is taken as logical one and a less negative, or zero, voltage is taken as logical zero) or other binary logic systems can be used.

Greater detail concerning the use of the present invention in conjunction with an eddy current probe is found in the application by David C. Copley, Ser. No. 404,687, filed 8-3-82, entitled "Eddy Current Microscope", which is concurrently filed herewith, which is assigned to a common assignee, and which is incorporated by reference herein.

One embodiment of the present invention has been described. It is to be recognized that numerous substitutions and modifications can be undertaken without changing the true spirit and scope of the present invention as identified in the following claims.

What is claimed is:

1. In a system which generates an analog signal indicative of the surface condition of an object and which, using an electrode pen, produces burn marks on a record which vary along a color spectrum ranging from light to dark, the improvement comprising:
   (a) a signal quantizer for processing the analog signal which includes
      (i) means for establishing a plurality of signal thresholds,
      (ii) means for identifying the largest signal threshold reached by the analog signal, and
      (iii) means for
         A. amplifying the signal threshold identified in (a)(ii) and
         B. transmitting the amplified signal to the electrode pen for quantizing the burn marks.

* * * * *